United States Patent [19]
Turvey

[11] Patent Number: 6,160,325
[45] Date of Patent: Dec. 12, 2000

[54] POWER SWITCHING CIRCUIT FOR USE IN A POWER DISTRIBUTION SYSTEM

[75] Inventor: Simon Turvey, Birmingham, United Kingdom

[73] Assignee: Lucas Industries plc, United Kingdom

[21] Appl. No.: 09/232,005

[22] Filed: Jan. 14, 1999

[30] Foreign Application Priority Data

Jan. 17, 1998 [GB] United Kingdom .................... 9800925

[51] Int. Cl.7 .................................................. H01H 47/00
[52] U.S. Cl. ............................................ 307/125; 327/479
[58] Field of Search .................................... 307/125, 147, 307/131, 32, 87, 35, 31, 34, 38, 39; 361/5, 8; 327/479

[56] References Cited

U.S. PATENT DOCUMENTS

| | | | |
|---|---|---|---|
| 3,751,676 | 8/1973 | Igaraashi et al. ........................ | 307/31 |
| 4,812,943 | 3/1989 | Jones et al. .............................. | 361/92 |
| 5,291,082 | 3/1994 | Revillet et al. . | |
| 5,585,994 | 12/1996 | Tamai et al. ............................. | 361/98 |
| 5,892,450 | 4/1999 | Scoones et al. . | |

FOREIGN PATENT DOCUMENTS

2 680 925  3/1993  France .

*Primary Examiner*—Josie Ballato
*Assistant Examiner*—Robert L. DeBeradinis
*Attorney, Agent, or Firm*—Andrus, Sceales, Starke & Sawall

[57] ABSTRACT

A power switching circuit includes first and second semiconductor switches providing parallel paths connecting a load across a power supply. A circuit maintains the second switch in an off state except when the current in the first switch exceeds a predetermined value.

7 Claims, 6 Drawing Sheets

POWER SWITCHING CIRCUIT FOR USE IN A POWER DISTRIBUTION SYSTEM

This invention relates to a power switching circuit for use in a power distribution system in which a plurality of distributed power switching circuits are controlled from a central control apparatus. It has already been proposed to control a plurality of power switching circuits from a central control apparatus, in which the power switching circuits include current sensing means which transmit current indicative signals to the central control apparatus periodically and these current indicative signals are processed by the central control apparatus in accordance with algorithms stored within the control apparatus. $I^2T$ calculations for each power switching circuit are executed within the central control apparatus and control signals are transmitted to respective ones of the power switching circuits to maintain or interrupt current therethrough in accordance with the results of the calculations.

Difficulties can arise in the prior art systems to produce an accurate current indicative signal, particularly when the current is at the lower end of a wide current range.

Accordingly, in accordance with one aspect of the present invention there is provided a power switching circuit for use in a power distribution system comprising first and second semiconductor switch elements providing parallel paths connecting a load across a power source, and means sensitive to the current flowing through said first semiconductor switch element, for maintaining said second semiconductor switch element in an off state except when the current in said first semiconductor switch element exceeds a predetermined value.

Preferably, said parallel paths comprise a first path containing said first semiconductor switch element and a first current sensing resistor in series and a second path containing the said second semiconductor switch element, a second current sensing resistor being connected in common in both paths.

With this arrangement, current flowing through the first semiconductor switch element flows through the first and second current sensing resistors in series and current flowing through the second semiconductor switch element flows through the second current sensing resistor alone.

Conveniently, said means sensitive to the current flowing in said first semiconductor switch element is sensitive to the combined voltage drop developed across said first and second current sensing resistors in series.

Preferably the circuit includes a current monitor device for producing a current indicative signal for transmission to a central control apparatus, said current monitoring device being sensitive to the voltage across the first and second current sensing resistors in series at low load current levels and to the voltage across the second current sensing resistor alone at higher load current levels.

The second current sensing resistor may be of lower ohmic value than the first current sensing resistor, in which case an amplifier may be provided for amplifying the voltage signal developed across the second current sensing resistor, the combined voltage drop across the first and second current sensing resistors in series when the entire load current is passing through said first semiconductor switch element exceeding the output of the amplifier resulting from the voltage drop in the second current sensing resistor.

The current monitor device preferably includes an analog to digital converter. Such converter may take the form of an integrator connected to provide an output voltage ramp, the gradient of which is dependent on the current flow in said current sensing resistors, a voltage window detector connected to receive said output voltage and digital counting means for obtaining a digital count dependent on the time taken for the voltage ramp to traverse the range of the voltage window detector.

The digital counting means may form part of a logic array which controls the first and second semiconductor switch elements.

Examples of the invention are shown in the accompanying drawings, in which.

Figure 1:
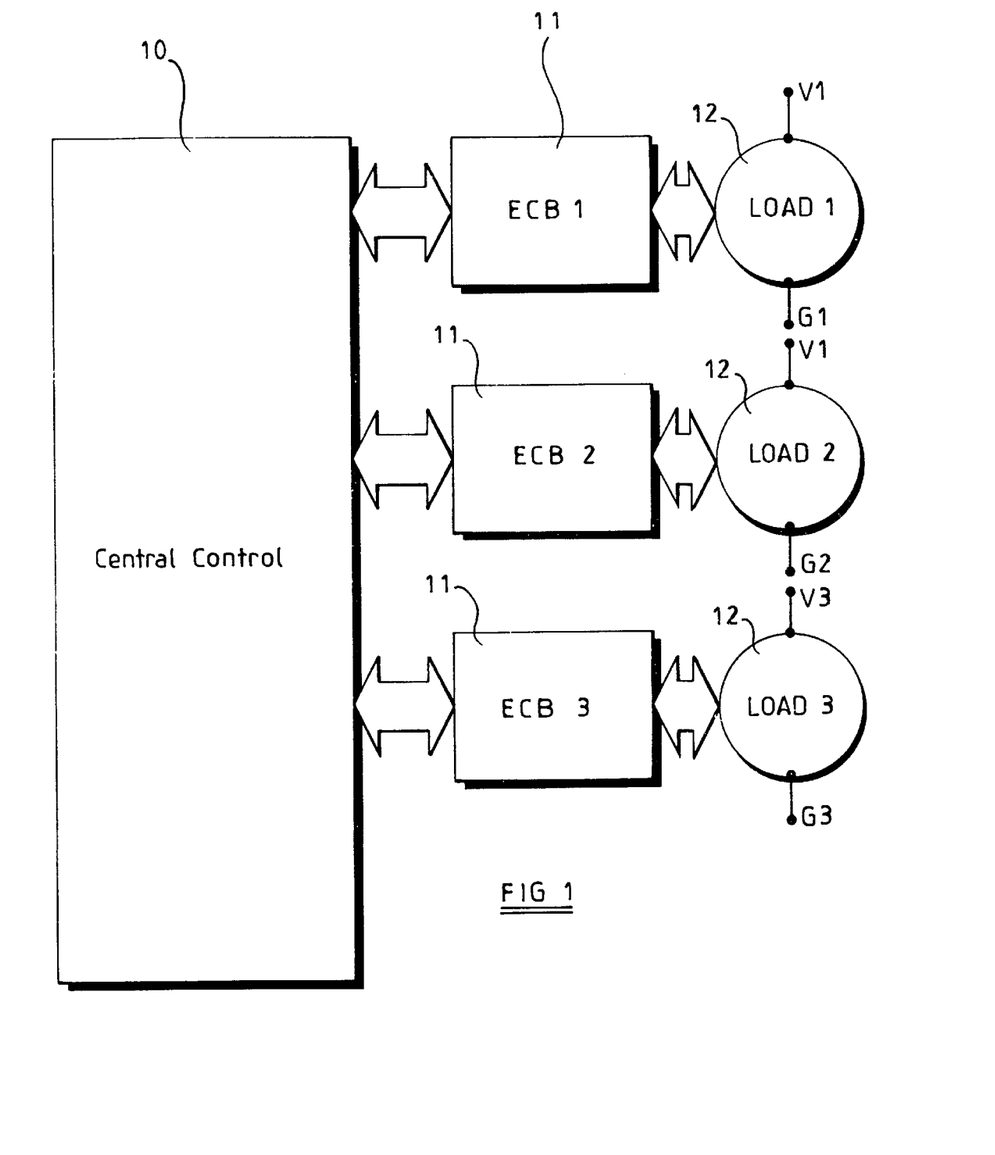
FIG. 1 is a block diagram of a multi-channel power distribution system.

Referring firstly to FIG. 1, the system shown includes a central control 10 which is a special purpose digital controller based on an ASIC which is programmed to control a plurality of remote distributed power switching circuits 11 each controlling a load 12. The central control sends signals out to the switching circuits 11 to determine whether semiconductor power switch elements therein are rendered conductive or not to connect respective loads 12 across various power supplies or disconnect them therefrom. Each power switching circuit includes voltage and current monitoring arrangements which monitor the current in the associated load and digital signals indicating the current level are transmitted back to the central control. The central control operates software which monitors the individual load currents and performs $I^2T$ calculations repeatedly for each load, based on data concerning each switching circuit and its load which is read into the ASIC at power up. Should the program determine that the current in a particular load is excessive, the signal transmitted to the associated power switching circuit will be changed to indicate that the current should be interrupted.

Figure 2:
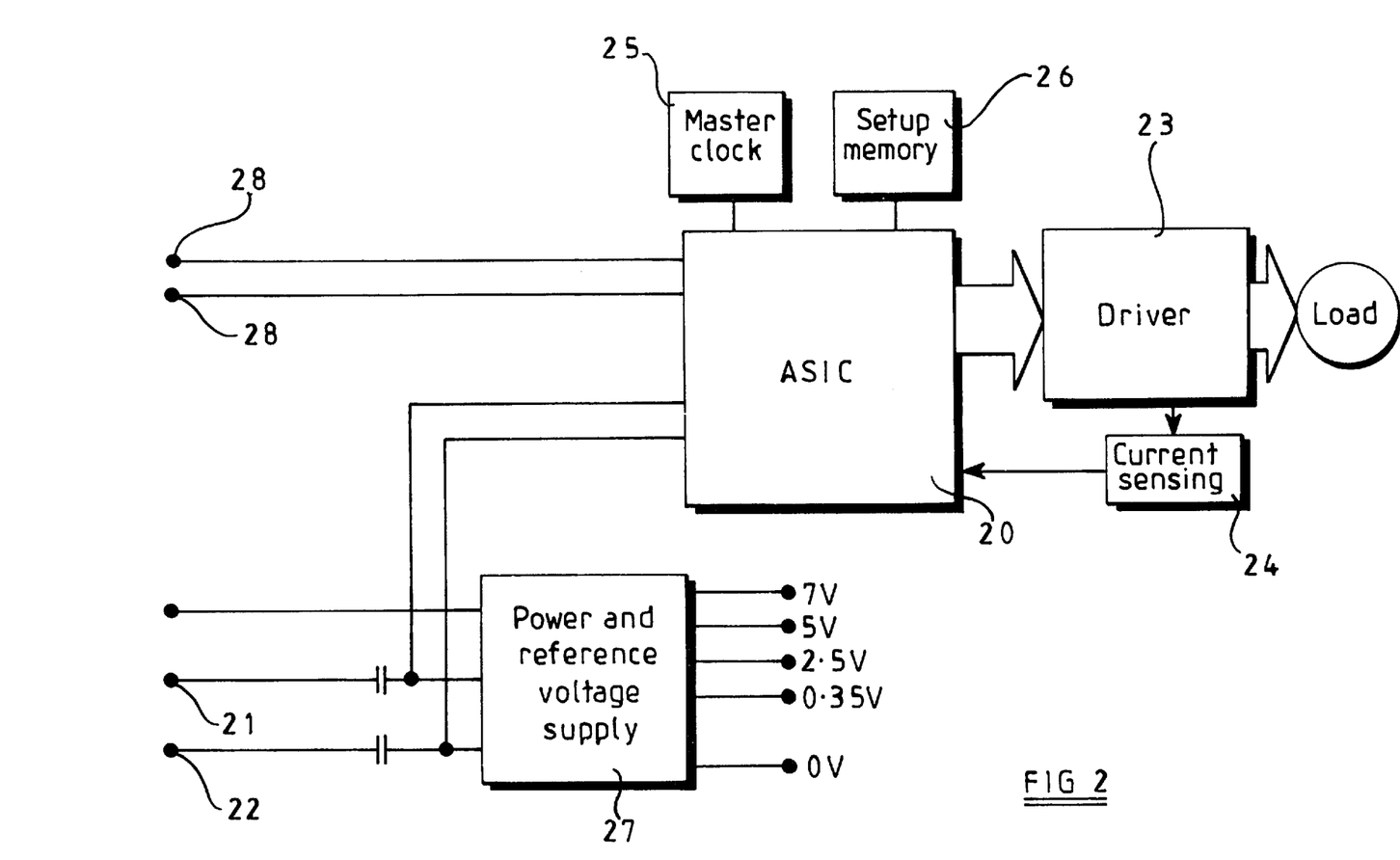
FIG. 2 is a block diagram of one of a plurality of power switching circuits incorporated in the system of FIG. 1.
Figure 3:
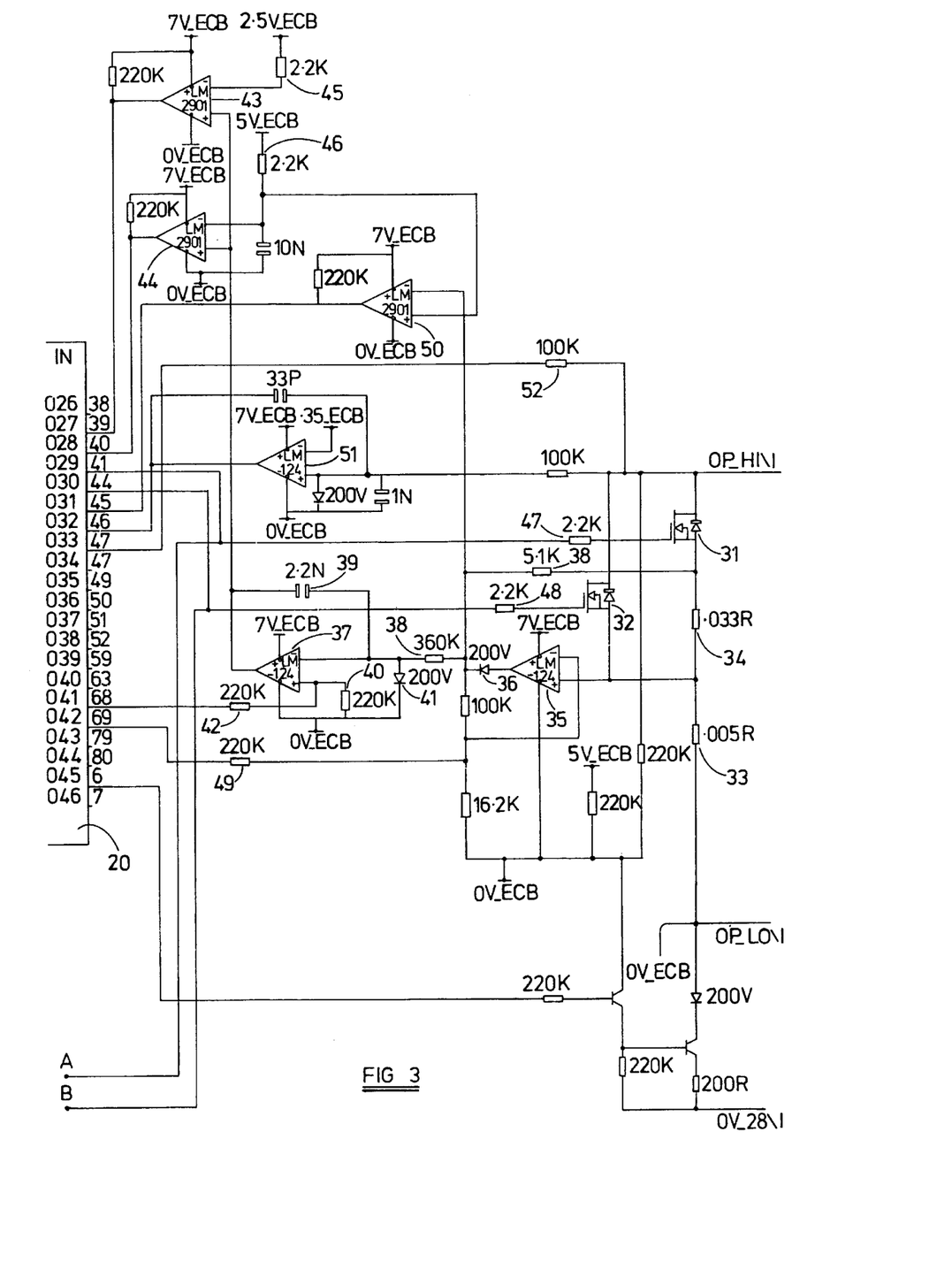
FIG. 3 is a circuit diagram of a driver and current sensing circuit forming part of the power switching circuit of FIG. 2.

FIG. 2 shows one of the power switching circuits in more detail. The circuit is based on an ASIC 20 which receives control and power signals at input terminals 21 and 22. The ASIC controls a driver circuit 23 which includes semiconductor switching elements as shown in FIG. 3 to control the load and a current sensing arrangement 24 which feeds signals back into the ASIC. A master clock 25 provides a high frequency clock signal to the ASIC, which could be hard wired or which could, alternatively, load its programs and data at start up from a setup memory 26. The ASIC provides anti-phase output pulse trains at output terminals 28 which are fed back to the central control for computation of the load condition.

The control signals received at the input terminals 21 and 22 are oscillating signals which are in antiphase at the two terminals. The signals at the two terminals are asymmetrical, ie the durations of the logic high and low portions are unequal. When switch off is commanded, the frequency of the pulses is reduced to a relatively low level. When switch on is required the frequency of the pulses is increased to a higher level and the phase of the pulses is changed periodically, so that in alternate periods the logic high duration at one terminal is the shorter and in the remaining alternate periods the logic high duration is the longer. The ASIC program enables it to distinguish between the three conditions of the input signals it receives from the central control. In the switch on command condition, one set of the alternate periods is used to transmit series of digital pulses back to the central control.

Figures 4, 5:
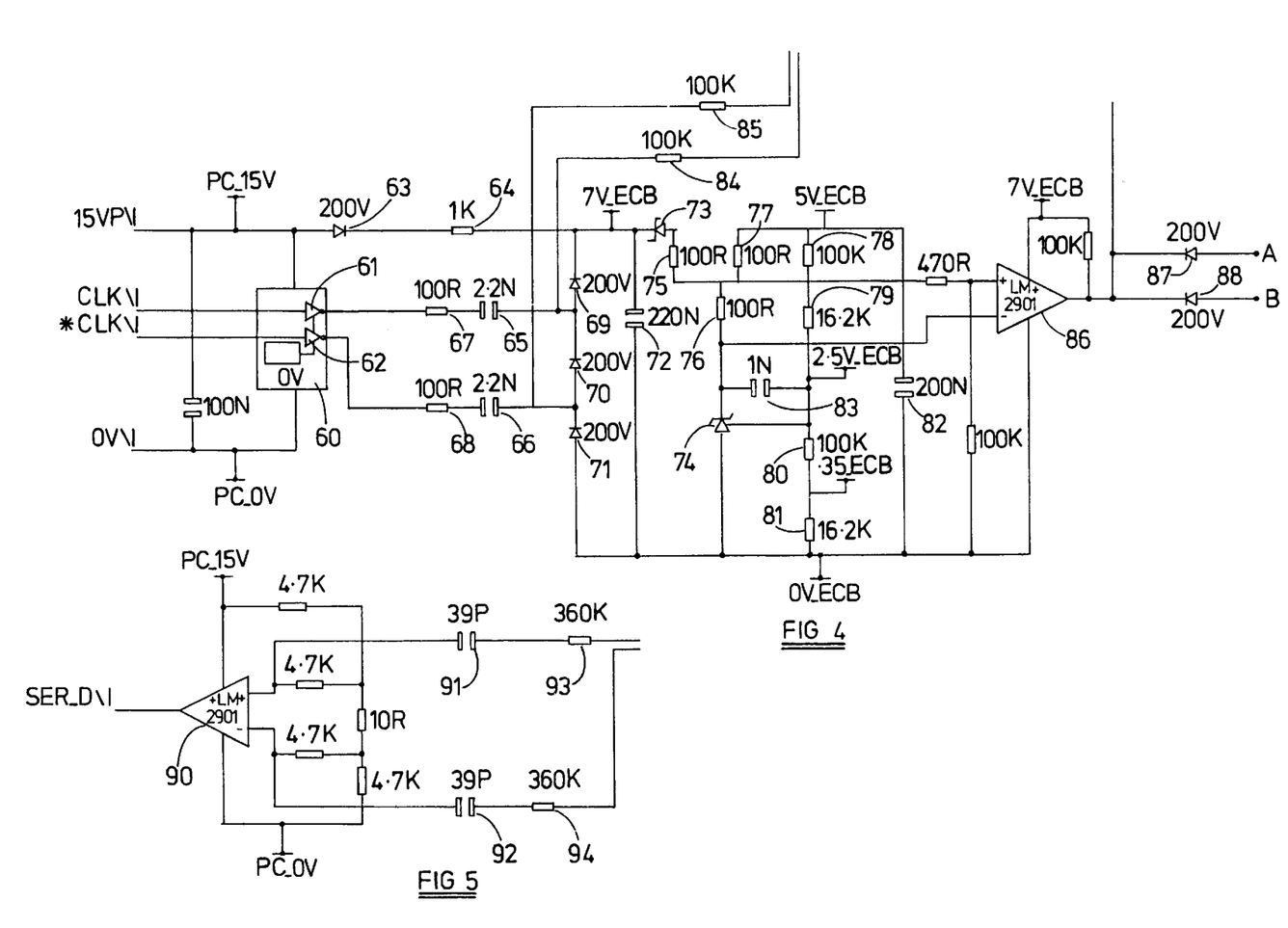
FIG. 4 is a circuit diagram of a power supply and reference voltage circuit forming part of the power switching circuit of FIG. 2 (also showing a transmission circuit forming part of the central control which forms part of the system shown in FIG. 1.
FIG. 5 is a circuit diagram of a receiver which forms part of the central control of FIG. 1.

The input signals from the central control are also used to provide power for the circuit elements of the power switch circuit. As shown in FIG. 2, a power and reference voltage supply block 27 provides outputs at 7V for the analog circuit elements, 5V for the digital elements, and 2.5V and 0.35V as reference voltages. More detail of the block 27 is shown in FIG. 4 which will be described in detail hereinafter.

The circuit shown in FIG. 3, includes two semiconductor switch elements in the form of MosFETs 31 and 32. The drain terminal of MosFET 32 is connected by the load (not shown) to a supply terminal and a resistor 33 of very low ohmic value (for example 0.005 ohms) connects the source terminal of MosFET 32 to a second supply terminal, so that the load is connected across the supply when the MosFET 32 is turned on. Another low ohmic value resistor 34 of larger ohmic value (for example 0.033 ohms) connects the source terminal of the MosFET 31 to the source terminal of the MosFET 32, the drain terminal of the MosFET 31 being connected to the drain terminal of the MosFET 32. Thus the two MosFETs provide two parallel load current paths. which share the resistor 33 in common. Load current flowing in MosFET 32 passes through resistors 33 and 34 in series, whereas load current flowing in MosFET 31 passes through the resistor 33 only.

The resistors 33 and 34 are used to monitor the load current. To this end, the voltage at the source terminal of the MosFET 32 is connected to the non-inverting input of an operational amplifier 35 connected as a non-inverting amplifier with a gain of about 7.2. The output of this amplifier is connected through a diode 36 to the input of an integrator based on an operational amplifier 37. A resistor 38 connects the source terminal of the MosFET 31 to the input of the integrator. If the MosFET 31 alone is conductive, the voltage at the source terminal of the MosFET 31 is approximate 7.6 times that at the input to the amplifier, so that the diode 36 blocks the output of the amplifier 35. A resistor 49 is connected between an output port of the ASIC to the inverting input terminal of the amplifier 35. This applies an accurately known offset to the amplifier 35 to ensure accurate measurement of current at low currents. When both MosFETs are conducting it is the amplifier 35 which provides the signal to be integrated.

The integrator forms part of an analog to digital converter. It includes an input resistor 38 and a feedback capacitor 39 connected to the inverting input of the amplifier 37 and a resistor 40 connecting the non-inverting input of the amplifier 37 to the local ground rail. A diode 41 connects the inverting input of the amplifier 37 to the ground rail, and a reset connection from the ASIC 20 is made via a resistor 42 connected to the non-inverting input of the amplifier 37. The analog to digital converter also includes a window detector in the form of two analog voltage comparators 43 and 44. The output of the integrator is connected to the non-inverting input terminal of each comparators. The comparator 43 has its inverting input connected by a resistor 45 to the 2.5 volt reference voltage supply terminal. The comparator 44 has its inverting input connected by a resistor 46 to the 5V voltage supply terminal. As the comparators 43 and 44 are of the open collector output type, each has a pull-up resistor connecting its output terminal to the 7V power supply terminal. The outputs of the comparators 43, 44 are connected to two input ports of the ASIC, which is programmed to the count master clock pulses which occur during each conversion cycle.

A conversion cycle starts with the integrator being reset by a pulse from the ASIC, which sets the output of the integrator to nearly 7V. The integrator output voltage decreases substantially linearly with time at a rate determined by the input voltage thereto. The counter in the ASIC is started when the input from the comparator 44 goes low. The counter is stopped when the output of the comparator 45 goes low. The count in each cycle is thus inversely proportional to the input voltage to the integrator which is substantially directly proportional to the load current.

The ASIC controls the two MosFETs 31, 32 directly, the gate terminals thereof being connected by resistors 47, 48 to two output ports of the ASIC. In use, the ASIC initially turns both MosFETs 31, 32 on and tests the current flowing so as to decide whether one or both MosFETs need to be used. When a low load current is required, the MosFET 32 does not remain conductive so that the voltage which is input to the integrator is determined by resistors 33 and 34 in series, the amplifier 35 output being blocked by the diode 36. Thus there are no errors caused by amplified offset voltages occurring in the amplifier 35. At higher currents, when both MosFETs conduct, the voltage which is integrated is from the amplifier 35.

It will be noted that the time taken for a digital count to be amassed in inversely proportional to the load current. This means that samples are available more frequently at high current levels than at low.

Also shown in FIG. 3 is an overcurrent detector based on a voltage comparator 50. This has its inverting input connected to the input of the integrator and its non-inverting input set to 5V, so that the output of the comparator goes low in an overcurrent situation and provides an input to an input port of the ASIC. The ASIC is programmed to turn off the MosFETs 31 and 32 when this input condition occurs without awaiting completion of the current conversion cycle.

There is also provided a load line voltage detector based on an operational amplifier 51 which provides an input to the ASIC, to signal excess voltage across the MosFETs in the on state. Resistor 52 enables the ASIC to detect that the MosFETs come out of saturation when they are switched on.

Turning now to FIG. 4, ic 60 is a transmitter which is included in the circuitry of the central control 10. It contains two amplifiers which transmit the asymmetrical antiphase clock signals from the central control 10. At the receiving input of the power switching circuit, there is a diode 63 connected to a +15v supply rail of the control 10 and a resistor 64 connecting this to a +7v supply rail of the circuit 27. This connection provides a power supply to the circuit 27 when the system is first switched on, but, as described hereinafter, ceases to have effect once the circuit 27 has settled into normal operation. Outputs from the two amplifiers 61 and 62 are connected by capacitors 65, 66, in series with respective ones of two resistors 67, 68 to a rectifier circuit comprising three diodes 69, 70 and 71 in series between the +7V supply rail and a local ground connection of the circuit 27. A capacitor 72 is connected between the +7V rail and the local ground. The circuit thus far described acts as a diode pump circuit which transfers energy from the antiphase clock pulses received by the circuit via the capacitors 65 and 66 into the capacitor 72.

The voltage on the +7v rail is regulated by a series circuit comprising a zener diode 73, a pair of equal value resistors 75 and 76 and a programmable zener diode 74 connected between the +7v rail and the local ground. A resistor 77 connects the junction of the resistors 75 and 76 to a +5V rail and the zener diode control input is connected to a point on a resistor chain 78,79,80 and 81 connected between the +5V rail and the local ground connection. There is a capacitor 82 connected between the +5v rail and the local ground and another 83 connected between the control input and the anode of the zener diode 74. The circuit described operates to clamp the input signals, which are passed via resistors 84, 85 to the input of the ASIC 20, to the +7v rail and to provide stable steady supply voltages at +7V and +5v for the remaining circuitry of the power switching circuit. The resistor chain also has tappings as shown providing reference voltages of +2.5v and +0.35V.

A voltage comparator 86 has its inputs connected to opposite ends of the resistor 76 so that normally its output is high. The output of the comparator 86 goes low, however, if the voltage at the +7v rail is not sustained by diode pump action. Diodes 87 and 88 connect the output of the comparator 86 to the gates of the two MosFETs 31 and 32, so that these cannot be turned on when the output of the comparator 86 is low.

The capacitors 65 and 66 provide the required pseudo-isolation barrier between the control 10 and the input of the power switching circuit 11. Whilst the power switching circuit 11 receives its operating power from the control 10, it is still possible for the power switching circuit to float relative to the control 10, thereby removing the possibility of ground loops and similar problems.

FIG. 5 shows the receiver forming a part of the control 10, which receives signals transmitted to it by the ASIC 20, such signals containing data about the status and load current of the circuit 11. As shown, the receiver is in the form of a voltage comparator 90, which has its inputs connected via isolation capacitors 91 and 92 and resistors 93 and 94 to the ASIC outport port connections. A resistor network provides appropriate bias voltages at the inputs of the comparator, such that the anti-phase signals output by the ASIC are received on a single output line.

Figure 6:
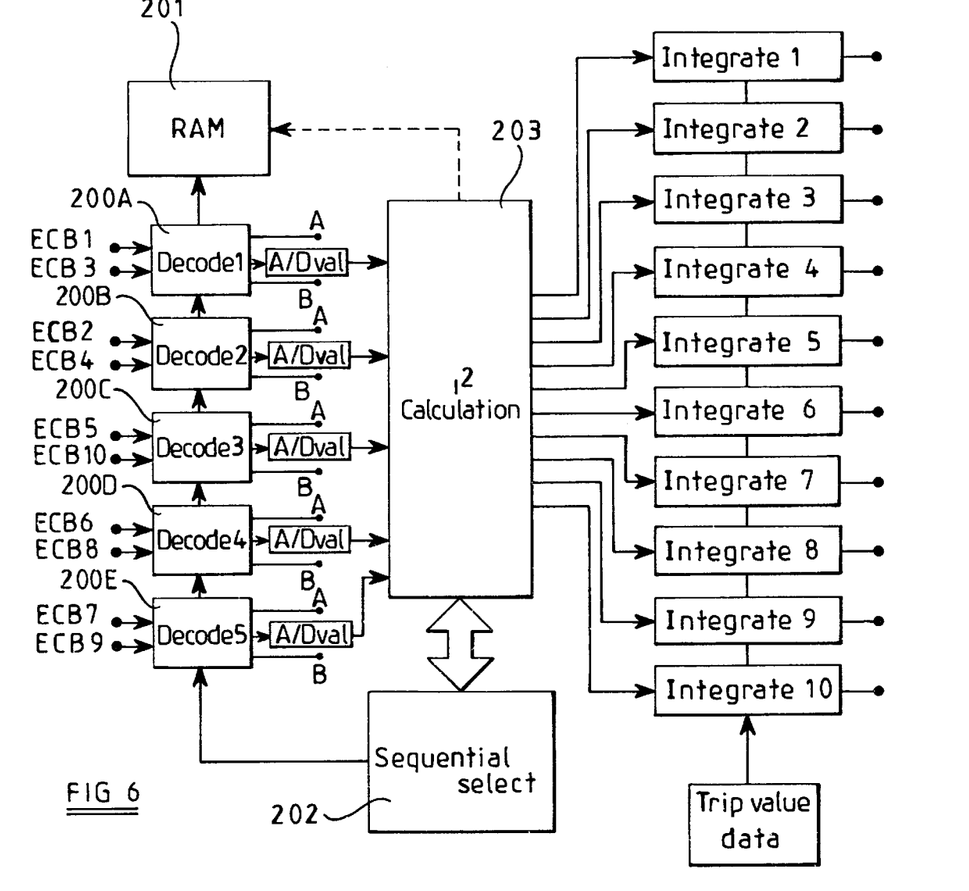
FIG. 6 is a block diagram of the control circuit which forms a part of the system shown in FIG. 1.

FIG. 6 shows the function of the control 10. For the ten channels of the system there are five shared decoders 200A to 200E. Each is connected to two of the receivers of FIG. 5. Input from the two associated receivers is enabled every 250 µS, the receivers being polled alternately. Data is received in each cycle only if it is new. The decoder interprets the Manchester encoded serial data stream received and, when data is received sets a flag to indicate the data for the associated channel is ready by setting an A-Value or B-Value register, passes the 20 bits of current data decoded to an A/D Value register, and passes the data received to RAM 201.

There is a single hardware module 202, 203 which polls the A-Value and B-Value register of all the decoders sequentially and processes new data found. The value held in the AID value register is inversely proportional to current and the module 203 is required to convert this rapidly into a value proportional to current. To effect this conversion with sufficient accuracy for the application, the data is loaded into a register and then shifted towards the MSB end of the register until the MSB value becomes 1. The five bits MSB-1 to MSB-5 are read into a look up table and a corrected value is read out. The other bits are inverted and the data is then shifted back the same number of steps.

Figure 7:
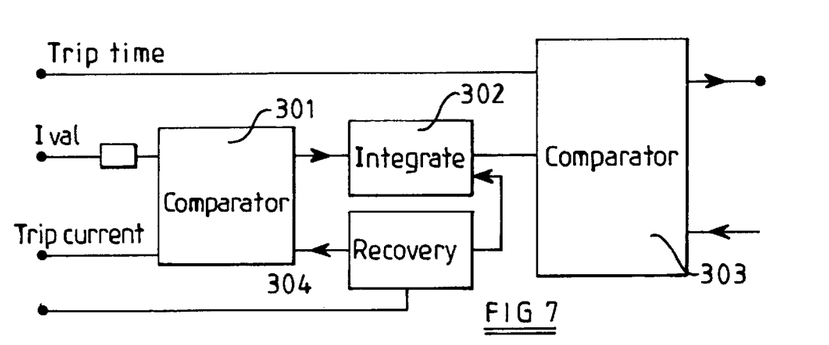
FIG. 7 is a block diagram of an integrator forming part of the circuit of FIG. 6.

The resulting data is then passed to one of ten integrators (one per channel), which receive trip value data at switch on from the PROM. As shown in FIG. 7, the integration process involves comparing the current value with a trip current in a comparator 30. If the current exceeds the trip current the current value is added to the integrator counter 302. The output of the integrator counter is compared with a trip time value in another comparator 303. A recovery counter 304 is used to decrement the integrator count at a variable rate determined by the trip value data.

Since the sampling frequency of the analog to digital conversion circuitry shown in FIG. 3 is directly proportional to the current, current data is passed from the converter to control more frequently as the current increases. The fast algorithm used by the module 203 ensures that it can convert data from all the decoders in each 250 µS period. Thus an 12 function is effectively provided by passing data proportional to current to the integrators at a frequency proportional to current.

The valves from 203 are also stored in RAM 201. Hardware costs are minimised by utilising a single module 203 for all the channels, although separate decoders and integrators remain necessary.

Figure 8:
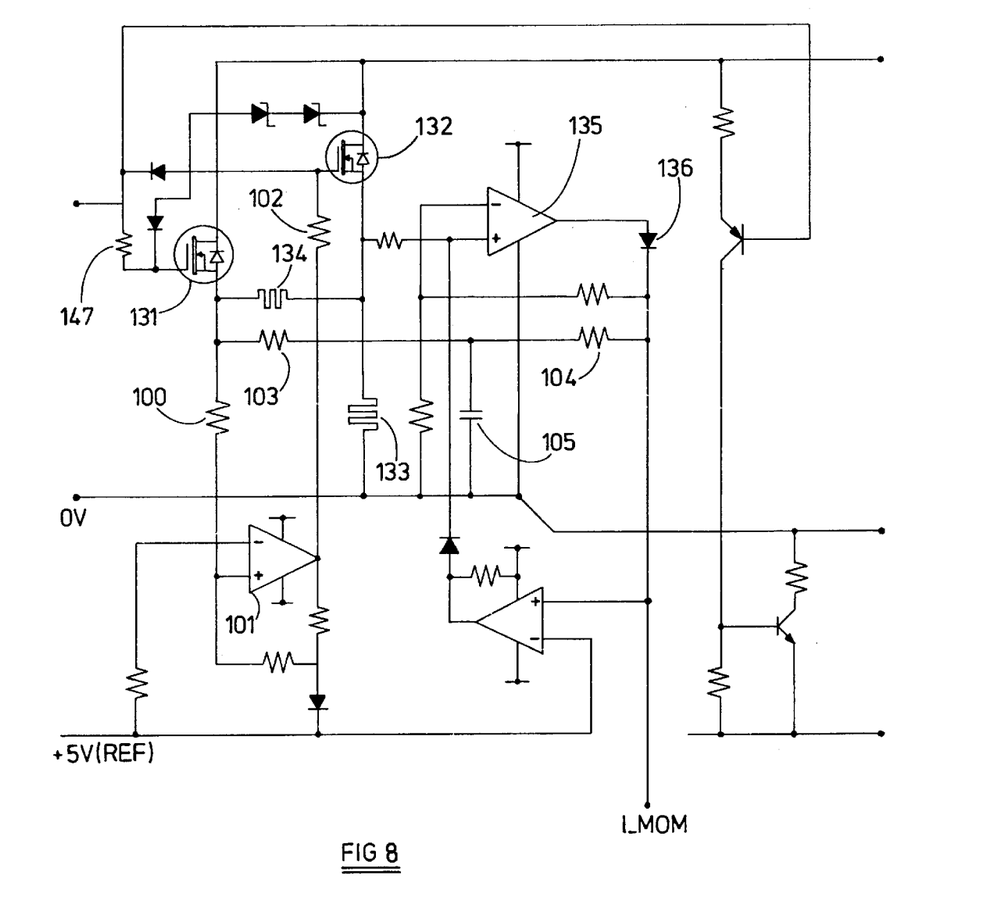
FIG. 8 is a circuit diagram of an alternative embodiment of the driver circuit which form a part of the circuit shown diagrammatically in FIG. 2.

FIG. 8 shows another embodiment of part of the circuit shown in FIG. 3, but utilising analog circuitry for the control of the output MosFETs 131 and 132. A single input terminal is connected by a resistor 147 to the gate of the MosFET 131. Current sensor resistors 133 and 134 are provided as in FIG. 3, but the combined voltage developed across these resistors is fed via a resistor 100 to the non inverting input of a comparator 101, which is connected to provide positive feedback to the non-inverting input and compares the voltage at the non inverting input to a fixed reference voltage (say +2.5v). The output of the comparator 101 is connected by a resistor 102 to the gate of the MosFET 132, to turn it on when the current in the MosFET 131 exceeds a predetermined value. The current sensing arrangement is similar to that used in FIG. 3, utilising an amplifier 135 to amplify the voltage signal across the resistor 133 and a direct connection via a noise filter comprising two resistors 103 and 104 and a capacitor 105 is provided between the source terminal of MosFET 131 and the output of amplifier 135, to provide the current sensor signal at very low current levels.

What is claimed is:

1. A power switching circuit for use in a power distribution system comprising:
    first and second semiconductor switch elements providing parallel paths connecting a load across a power source, said parallel paths comprising a first path containing said first semiconductor switch element and a first current sensing resistor in series and a second path containing the said second semiconductor switch element, a second current sensing resistor being connected in common in both paths; and
    means sensitive to the current flowing through said first semiconductor switch element, for maintaining said second semiconductor switch element in an off state except when the current in said first semiconductor switch element exceeds a predetermined value, said means sensitive to the current flowing in said first semiconductor switch element being sensitive to the combined voltage drop developed across said first and second current sensing resistors in series.

2. A power switching circuit as claimed in claim 1, including a current monitor device for producing a current indicative signal for transmission to a central control apparatus, said current monitoring device being sensitive to the voltage across the first and second current sensing resistors in series at low load current levels and to the voltage across the second current sensing resistor alone at higher load current levels.

3. A power switching circuit as claimed in claim 2, in which said second current sensing resistor is of lower ohmic value than the first current sensing resistor.

4. A power switching circuit as claimed in claim 3, in which an amplifier is provided for amplifying the voltage signal developed across the second current sensing resistor, the combined voltage drop across the first and second current sensing resistors in series when the entire load current is passing through said first semiconductor switch element exceeding the output of the amplifier resulting from the voltage drop in the second current sensing resistor.

5. A power switching circuit as claimed in claim 2, in which said current monitor includes an analog to digital converter.

6. A power switching circuit as claimed in claim 5, in which said converter comprises an integrator connected to provide an output voltage ramp, the gradient of which is dependent on the current flow in said current sensing resistors, a voltage window detector connected to receive said output voltage and a digital counting means for obtaining a digital count dependent on the time taken for the voltage ramp to traverse the range of the voltage window detector.

7. A power switching circuit as claimed in claim 6, including a logic array controlling said first and second semiconductor switch elements and incorporating said digital counting means.

* * * * *